(12) United States Patent
Xu et al.

(10) Patent No.: US 9,087,732 B1
(45) Date of Patent: Jul. 21, 2015

(54) WAFER-LEVEL PACKAGE DEVICE HAVING SOLDER BUMP ASSEMBLIES THAT INCLUDE AN INNER PILLAR STRUCTURE

(71) Applicant: Maxim Integrated Products, Inc., San Jose, CA (US)

(72) Inventors: Yong L. Xu, Plano, TX (US); Viren Khandekar, Flower Mound, TX (US); Yi-Sheng A. Sun, San Jose, CA (US); Arkadii V. Samoilov, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/170,824

(22) Filed: Feb. 3, 2014

Related U.S. Application Data

(62) Division of application No. 13/396,804, filed on Feb. 15, 2012, now Pat. No. 8,643,150.

(51) Int. Cl.
*H01L 21/44* (2006.01)
*H01L 23/00* (2006.01)

(52) U.S. Cl.
CPC ............... *H01L 24/11* (2013.01); *H01L 24/94* (2013.01)

(58) Field of Classification Search
USPC .......................................... 438/613
See application file for complete search history.

(56) References Cited

U.S. PATENT DOCUMENTS

| | | | |
|---|---|---|---|
| 6,028,357 A | 2/2000 | Moriyama | |
| 6,429,046 B1 * | 8/2002 | Marlin | 438/108 |
| 6,806,562 B2 | 10/2004 | Barchmann et al. | |
| 6,927,471 B2 | 8/2005 | Salmon | |
| 7,750,466 B2 | 7/2010 | Rothman et al. | |
| 8,872,306 B2 * | 10/2014 | Jin et al. | 257/529 |
| 2006/0055032 A1 | 3/2006 | Chang et al. | |
| 2006/0292711 A1 | 12/2006 | Su et al. | |
| 2010/0102444 A1 | 4/2010 | Khor et al. | |
| 2011/0291273 A1 * | 12/2011 | Huang | 257/738 |
| 2012/0043655 A1 | 2/2012 | Khor et al. | |
| 2014/0070401 A1 * | 3/2014 | Daubenspeck et al. | 257/737 |

* cited by examiner

*Primary Examiner* — Thao P Le
(74) *Attorney, Agent, or Firm* — Advent, LLP (57) ABSTRACT

Wafer-level package (semiconductor) devices are described that have a pillar structure that extends at least partially into a solder bump to mitigate thermal stresses to the solder bump. In implementations, the wafer-level package device may comprise an integrated circuit chip having a surface and a solder bump disposed over the surface. The wafer-level package device may also include a pillar structure disposed over the surface that extends at least partially into the solder bump.

9 Claims, 12 Drawing Sheets

WAFER-LEVEL PACKAGE DEVICE HAVING SOLDER BUMP ASSEMBLIES THAT INCLUDE AN INNER PILLAR STRUCTURE

CROSS-REFERENCE TO RELATED APPLICATIONS

The present application is a divisional under 35 U.S.C. §120 of U.S. patent application Ser. No. 13/396,804 filed Feb. 15, 2012, entitled "WAFER-LEVEL PACKAGE DEVICE HAVING SOLDER BUMP ASSEMBLIES THAT INCLUDE AN INNER PILLAR STRUCTURE." U.S. application Ser. No. 13/396,804 is herein incorporated by reference in its entirety.

BACKGROUND

Traditional fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

Over the years, packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging (WLP) is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

SUMMARY

Techniques are described for fabricating wafer-level package devices that have one or more solder bump assemblies which include an inner pillar structure. In implementations, the wafer-level package devices comprise an integrated circuit chip. One or more pillar structures are disposed over the integrated circuit chip. Solder bumps are disposed over the pillar structure so that the pillar structure extends at least partially into the solder bump.

The wafer-level package devices may be fabricated using a process that includes applying a bump interface to a contact pad of a semiconductor wafer that has been processed to form one or more integrated circuits therein. A pillar structure is then formed over the bump interface. A solder ball is placed onto the pillar structure and reflowed over the pillar structure and the bump interface to form a solder bump, wherein the pillar structure extends at least partially into the solder bump.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Wafer-level packaging facilitates the production of semiconductor devices that are lower in cost, have smaller form factors, and provide lower parasitic effects than devices manufactured utilizing many other packaging technologies. However, the application of wafer-level packaging techniques has heretofore been limited to use in the production of devices using small integrated circuit chips (e.g., devices with dies having a die size of less than about 5.5×5.5 mm$^2$). For devices employing larger chips (e.g., having a die size between 5.5×5.5 mm$^2$ and 7.0×7.0 mm$^2$), the mismatch of the coefficient of thermal expansion (CTE) between the chip and the printed circuit board (FR4) to which the device is mounted becomes significant. During thermal cycling tests, this mismatch can cause high stress and cracks in solder bumps used to mount the device to the printed circuit board. Moreover, electrical migration tests may result in greater current density through the solder bumps, which also results in cracking of the solder bumps.

Accordingly, techniques are described for fabricating wafer-level package (semiconductor) devices that have one or more solder bump assemblies which include a solder bump and an inner pillar structure that extends at least partially into the solder bump. The pillar structures mitigate stress within the solder bumps, allowing for the provision of solder bump arrays having array sizes greater than fifteen by fifteen (15×15). The pillar structures may function as a physical barrier to crack propagation and strengthen the solder joint at the interface of the solder bump and the bump interface (e.g., under-ball metallization, copper pillar, and so forth). In an implementation, the pillar structure is fabricated of a copper material. For example, the pillar structure may be formed over the surface of the wafer-level package device (e.g., directly on the surface, on an intermediate layer or structure formed on the surface, combinations thereof, and so forth) through a suitable copper plating process, and so forth. In other implementations, the pillar structure may be selectively provided within solder bumps occurring about the periphery (e.g., near the edge) of the wafer-level package device to prolong the solder fatigue life of the device.

Example Implementations

Figure 1A:
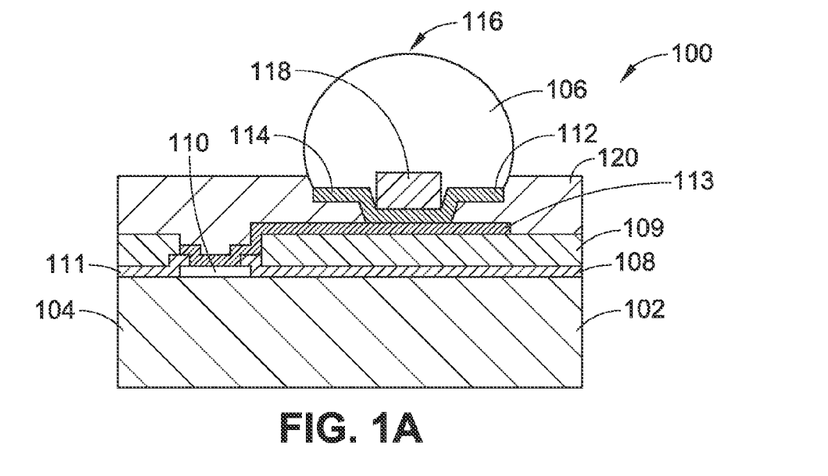
FIGS. 1A through 1W are diagrammatic partial cross-sectional side elevation views illustrating wafer-level package devices in accordance with example implementations of the present disclosure, wherein the devices include an integrated circuit chip, a solder bump disposed over the integrated circuit chip, and a pillar structure extending from the integrated circuit chip and at least partially into the solder bump.
Figure 1B:
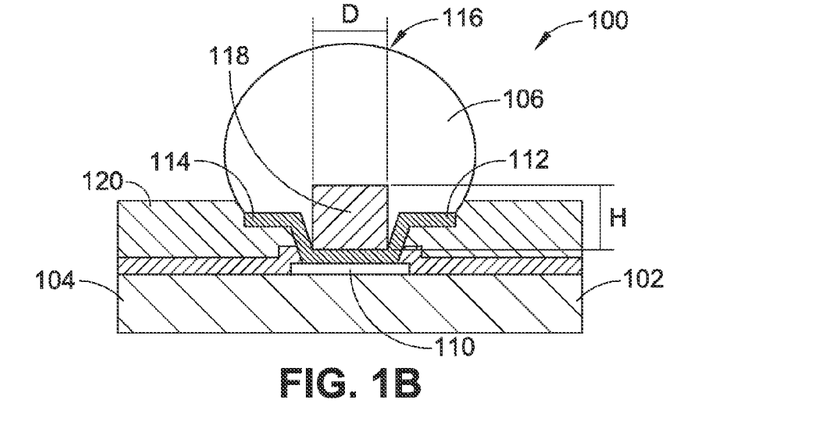
Figure 1C:
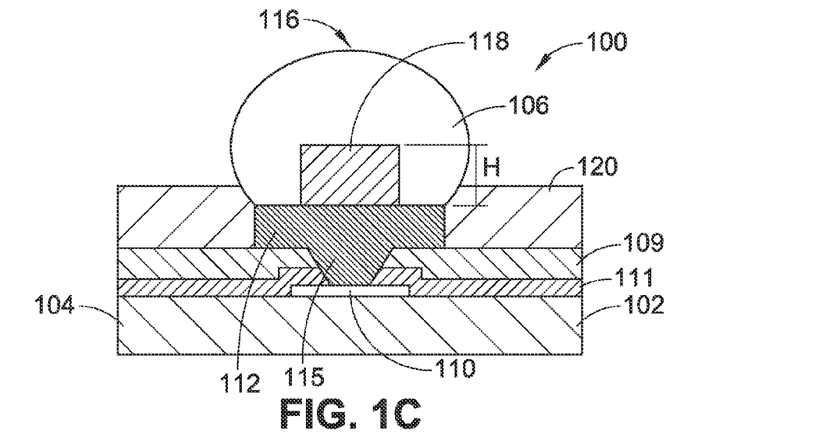
Figure 1D:
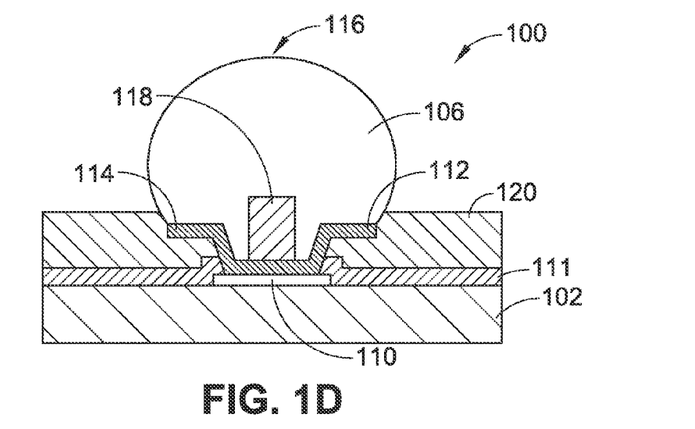
Figure 1E:
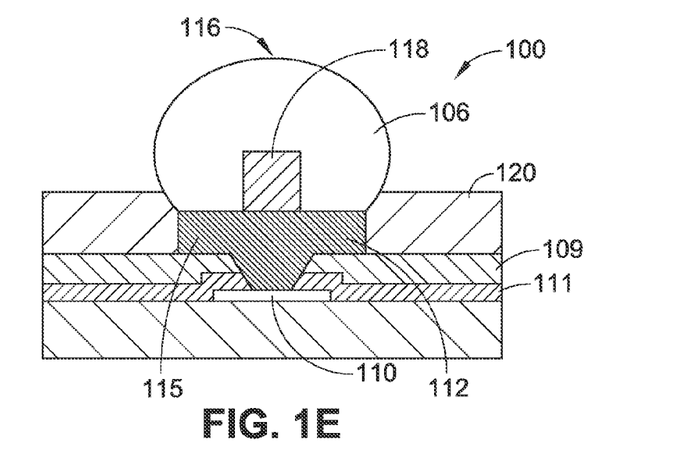
Figure 1F:
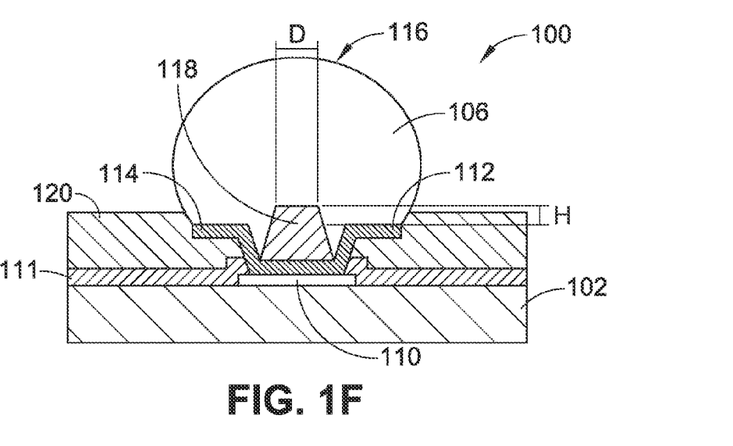
Figure 1G:
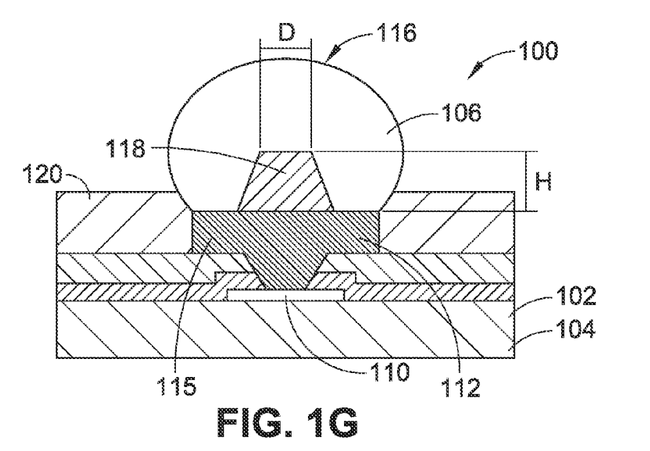
Figure 1H:
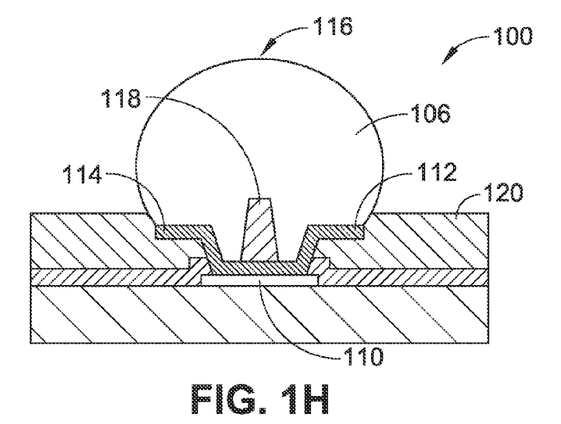
Figure 1I:
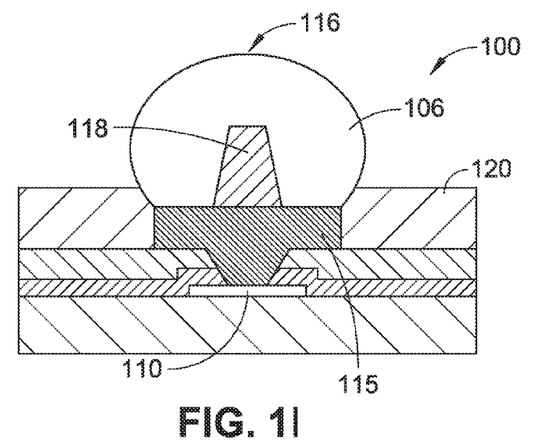
Figure 1J:
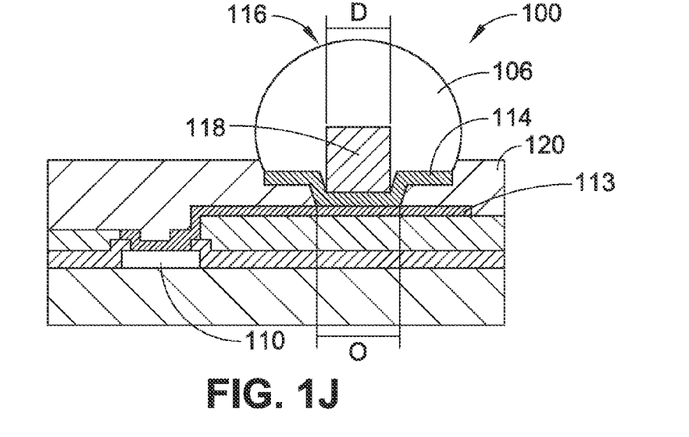
Figure 1K:
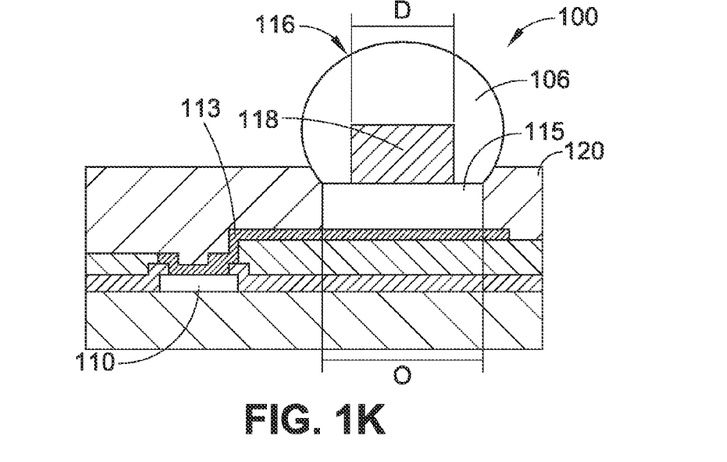
Figure 1L:
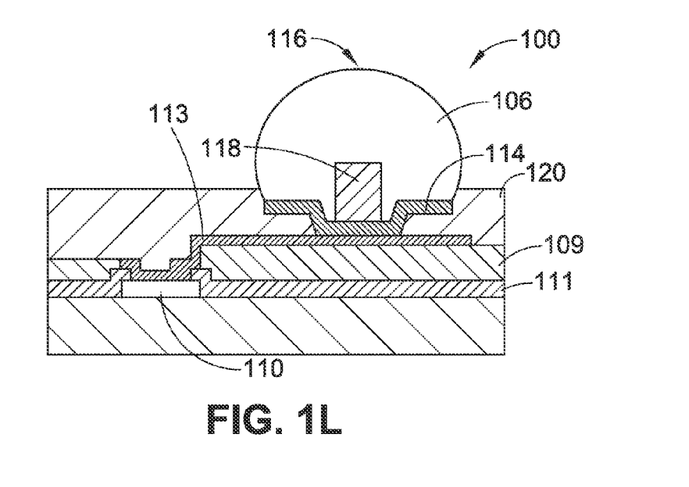
Figure 1M:
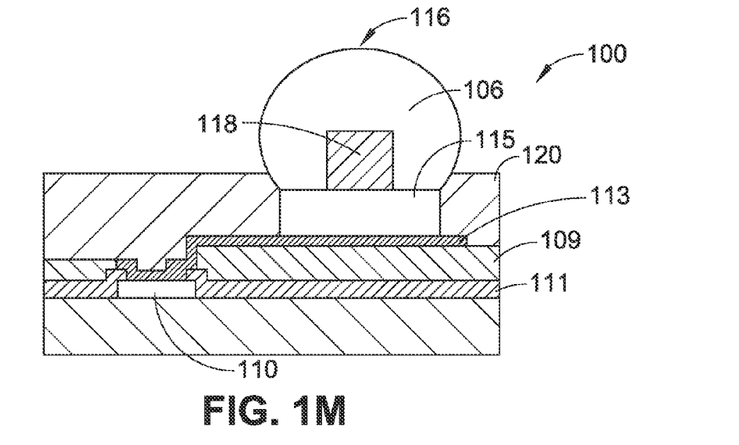
Figure 1N:
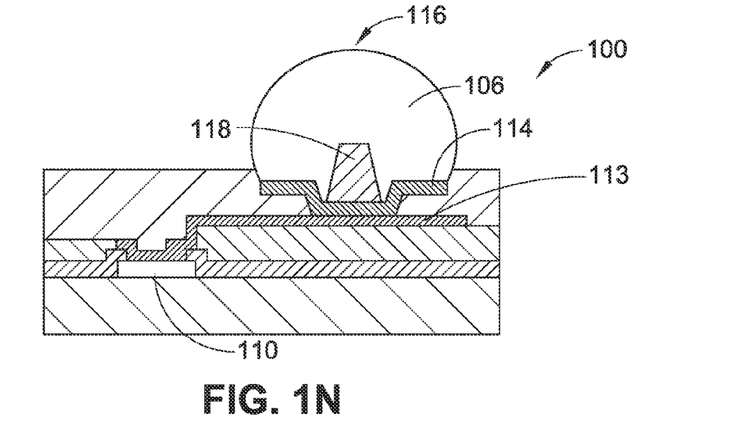
Figure 1O:
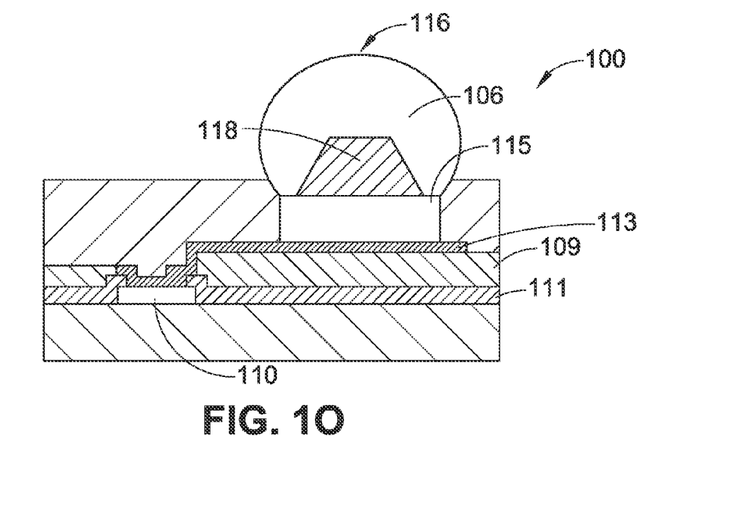
Figure 1P:
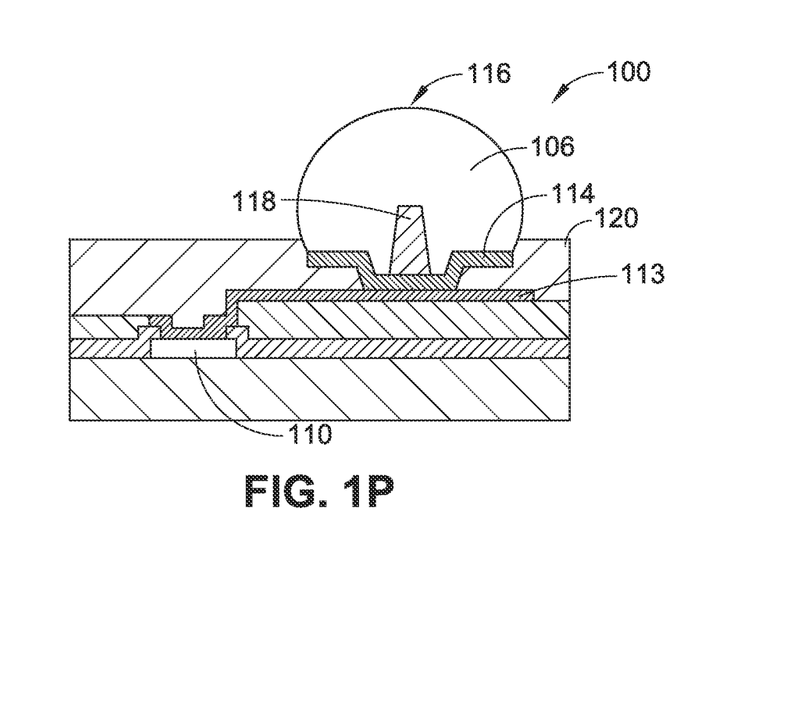
Figure 1Q:
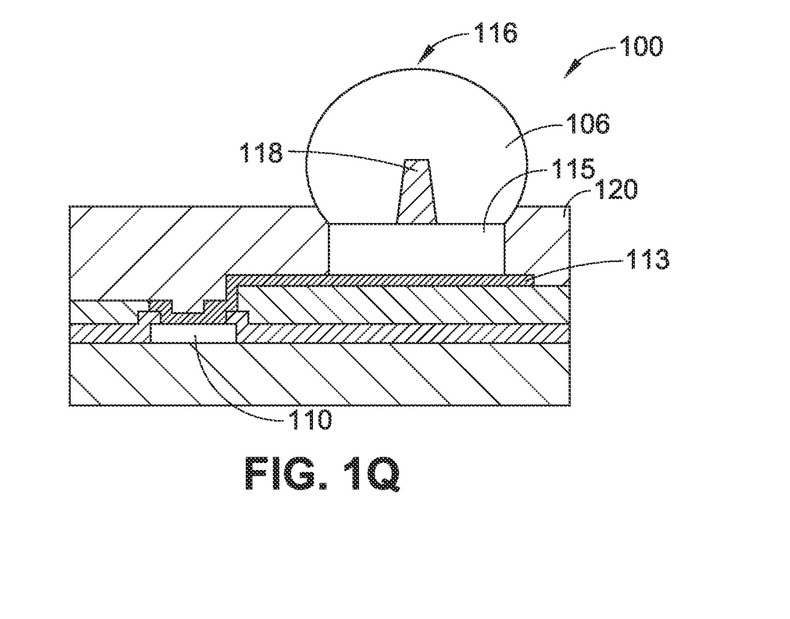
Figure 1R:
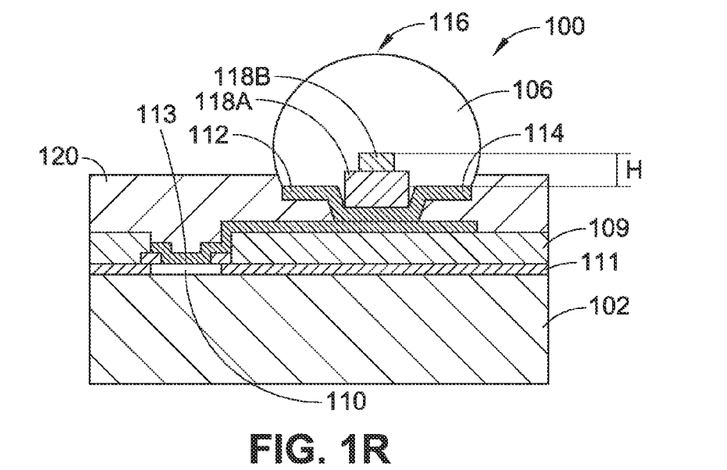
Figure 1S:
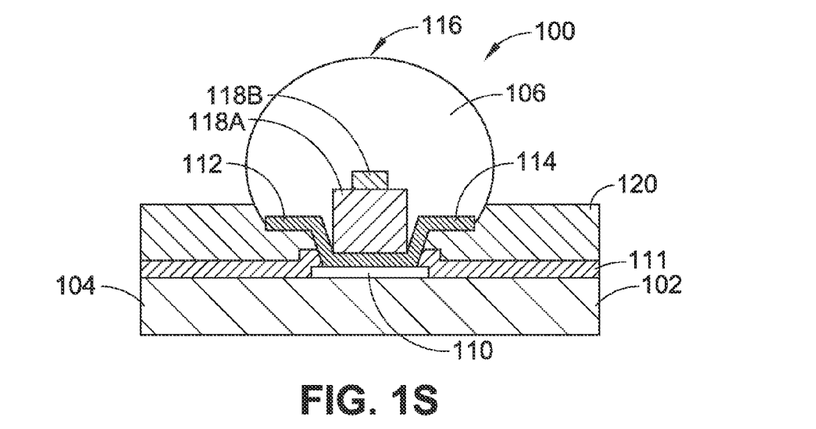
Figure 1T:
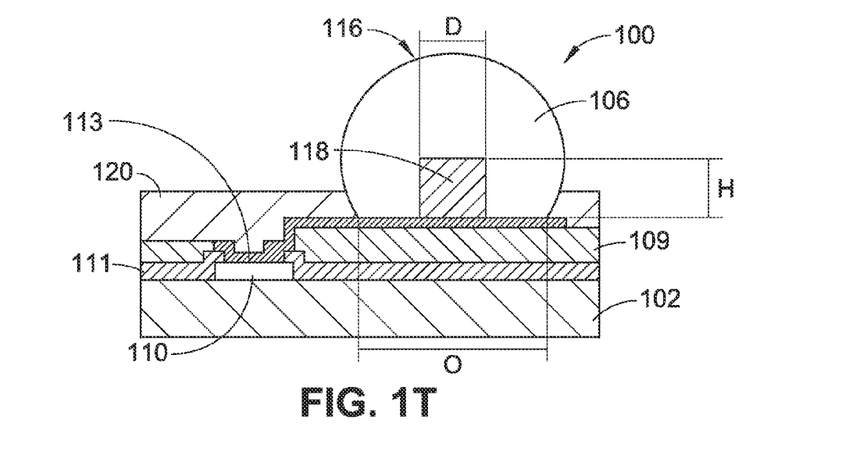
Figure 1U:
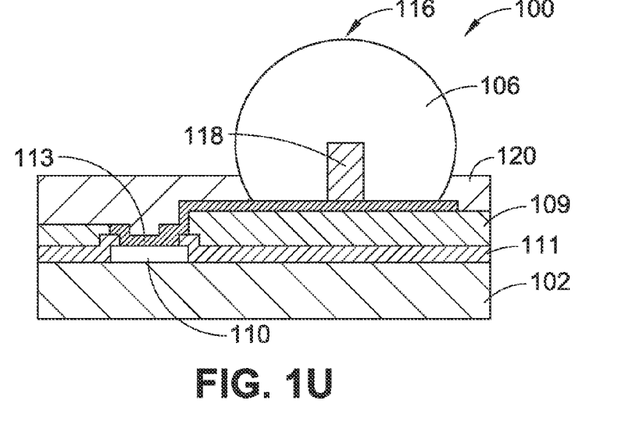
Figure 1V:
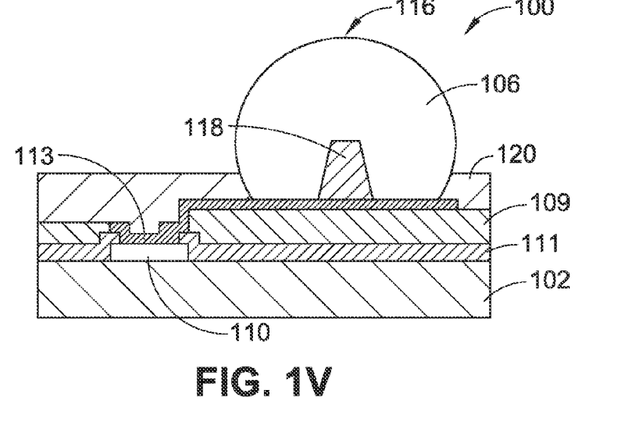
Figure 1W:
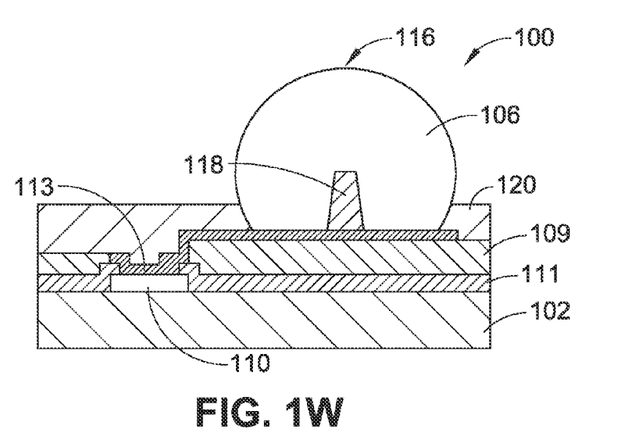

FIGS. 1A through 1W illustrate wafer-level package devices 100 in accordance with example implementations of the present disclosure. As shown, the wafer-level package devices 100 include an integrated circuit chip 102 comprised of a semiconductor substrate 104 having solder bumps 106 disposed over a surface 108 of the substrate 104 (e.g., directly on the surface 108, on an intermediate layer or structure formed on the surface 108, combinations thereof, and so forth). The semiconductor substrate 104 may be fabricated as a portion of a semiconductor wafer, such as a silicon wafer (e.g., p-type wafer, n-type wafer, and so forth), a germanium wafer, and so forth, that includes one or more integrated circuits formed therein. The integrated circuits may be formed through suitable front-end-of-line (FEOL) fabrication techniques. The integrated circuits may be configured in a variety of ways. For example, the integrated circuits may be comprised of digital circuit technology, analog circuit technology, mixed-signal technology, and so forth.

The integrated circuit chip 102 further includes one or more area arrays of contact pads 110 deployed over a surface 108 of the semiconductor substrate 104. The number and configuration of contact pads 110 may vary depending on the complexity and configuration of the integrated circuits, the size and shape of the substrate 104, and so forth. The contact pads 110 provide electrical contacts through which the integrated circuits are interconnected to external components such as other semiconductor devices, printed circuit boards, and so forth. In implementations, the contact pads 110 may comprise aluminum, and so forth. As shown in FIGS. 1A through 1W, one or more passivation layers (passivation layers 109, 111) may be disposed around the contact pads 110 to provide insulation to the integrated circuits and the contact pads 110. The passivation layers 109, 111 may be benzocyclobutene polymer (BCB), Polyimide (PI), Polybenzoxazole (PBO), silicon dioxide ($SiO_2$), combinations thereof, and so forth.

The wafer-level package devices 100 illustrated in FIGS. 1A through 1I and 1S employ a Bump-On-Pad ("BOP") configuration where the contact pad 110 is directly in contact with the bump interfaces 112 (e.g., UBM pads). However, as illustrated in FIGS. 1J through 1R and FIGS. 1T through 1W, the wafer-level package devices 100 may also employ a Redistribution Layer ("RDL") configuration. An RDL configuration includes a redistribution (RDL) structure 113 comprised of a thin-film metal (e.g., aluminum, copper) rerouting and interconnection system that redistributes the contact pads 110 to an area array of bump interfaces 112 (e.g., UBM pads) that may be more evenly deployed over the device 100. The solder bumps 106 are subsequently placed on these bump interfaces 112 to form solder bump assemblies 116.

As illustrated in FIGS. 1A through 1W, the solder bumps 106 furnish mechanical and/or electrical interconnection between the contact pads 110 and corresponding pads of a printed circuit board. In implementations, the solder bumps 106 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solders may be used. Example processes for forming the solder bumps 106 using wafer-level packaging techniques are described in more detail below.

Bump interfaces 112 may be applied to the contact pads 110 of the integrated circuit chip 102 to provide a reliable interconnect boundary between the contact pads 110 and the solder bumps 106. For instance, in the wafer-level package devices 100 shown in FIGS. 1A, 1B, 1D, 1F, 1H, 1J, 1L, 1N, 1P, 1R, and 1S, the bump interface 112 comprises an under-bump metallization structure (UBM) 114 applied to the contact pads 110 of the integrated circuit chip 102. The UBM 114 may have a variety of compositions. For example, the UBM 114 may include multiple layers of different metals (e.g., Aluminum (Al), Nickel (Ni), Copper (Cu), vanadium, and so forth) that function as an adhesion layer, a diffusion barrier layer, a solderable layer, an oxidation barrier layer, and so forth. However, other UBM structures are possible. As shown in FIGS. 1C, 1E, 1G, 1I, 1K, 1O, and 1Q, the wafer-level package device 100 illustrated employs a copper (Cu) pillar solder bump (CPB) structure. Thus, the bump interfaces 112 are comprised of copper pillars 115 formed on the contact pads 110 (or the RDL structure 113) in place of the UBM 114. An adhesion/barrier/seed layer may be applied to the contact pads 110 under the copper pillars 115 to improve the reliability of the interconnect interface.

Viewed together, the solder bumps 106 and associated bump interfaces 112 (e.g., UBM 114, copper pillars 115) comprise solder bump assemblies 116 that are configured to provide mechanical and/or electrical interconnection of the integrated circuit chip 102 to the printed circuit board. As illustrated in FIGS. 1A through 1S, the wafer-level package devices 100 may include one or more arrays of solder bump assemblies 116 depending on various design/fabrication considerations.

As illustrated in FIGS. 1A through 1S, the bump interfaces 112 include a pillar structure 118, which the solder bumps 106 are formed about. The pillar structure 118 extends at least partially into the solder bump 106 from the bump interface 112 (e.g., UBM 114, copper pillars 115) to mitigate thermal stresses to the solder bumps 106. The introduction of the pillar structure 118 into the solder bump 106 may reduce solder stress, reduce solder cracking, and reduce solder current density (e.g., slowing electrical migration) as compared to devices not having pillar structures 118. For instance, the pillar structure 118 may function as a physical barrier to crack propagation. The pillar structure 118 may also be configured to strengthen the solder joint at the interface of the solder bump 106 and the bump interface 112, as compared to wafer-level package devices not having the pillar structure 118. In implementations, the pillar structure 118 may be fabricated from one or more suitable conductive materials. For example, the pillar structure 118 may be fabricated from copper, and so forth. The pillar structure 118 also increases the solderable area to which the solder bump 106 can be adhered.

In one or more implementations, pillar structures 118 may be provided in substantially all solder bump assemblies 116 (e.g., in solder bumps 106) of the wafer-level package device 100. However, in other implementations, pillar structures 118 may be included only in selected solder bump assemblies 116. For instance, pillar structures 118 may be included in solder bump assemblies 116 that are disposed near the periphery of the device 100, while solder bump assemblies 116 located more proximate (e.g., nearer) to the center of the device 100 do not include pillar structures 118. For example, pillar structures 118 may be disposed within the solder bump assemblies 116 of one or more rows of an array of solder bump assemblies 116 that are located near the edges of the device 100, disposed in solder bump assemblies 116 located proximate to the corners of the device 100, and so forth. Similarly, pillar structures may be selectively disposed in solder bump assemblies 116 that may encounter high levels of stress, while pillar structures that are unlikely to encounter high levels of stress do not include pillar structures 118.

The height (e.g., thickness) and the diameter (e.g., width when viewed in cross-section) of the pillar structures 118 may vary according to various design/fabrication considerations (e.g., the array size of the devices 100, mechanical robustness considerations, and so forth) of the devices 100. In implementations, the pillar structures 118 may extend from the integrated circuit chip 102 to a height of about thirty-five micrometers (35 μm) to about sixty micrometers (60 μm). As shown in FIGS. 1B, 1F, and 1R, the height (H) of the pillar structure 118 is measured from the top surface (e.g., surface opposite (distal from) the substrate 104) of the UBM 114 to the top surface (e.g., surface opposite (distal from) the UBM 114) of the pillar structure 118. In another implementation, as shown in FIGS. 1C, 1G, and 1T, the height is measured from the base surface (e.g., surface proximal to the substrate 104) of the pillar structure 118 to the top surface (e.g., surface distal to the substrate 104) of the pillar structure 118. As described above, the diameter (D) of the pillar structure 118 may vary according to the various design/fabrication considerations of the devices 100. In implementations, the diameter of a cylindrically-shaped (e.g., rectangular cross-section) pillar structure 118 may range from about forty micrometer (40 μm) to about eighty percent (80%) of the diameter (O) of passivation layer 120 (e.g., polymer layer) opening (see FIGS. 1J, 1K, and 1T). In another implementation, as shown in FIGS. 1F and 1G, the diameter (D) of a conically-shaped (e.g., trapezoidal cross-section) pillar structure 118 may range from about thirty-five micrometers (35 μm) to about eighty percent (80%) of the diameter of passivation layer 120 (e.g., polymer layer) opening. Additionally, the pillar structure 118 may extend beyond the passivation layer 120. In implementations, the passivation layer 120 may be an epoxy material, a polymer material, and so forth.

FIGS. 1B through 1W illustrate various implementations of the pillar structure 118 in wafer-level package devices 100. FIGS. 1B through 1E illustrate devices 100 employing a BOP configuration that include a pillar structure 118 having a generally rectangular cross-section (e.g., a rectangular cube) of varying dimensions. FIGS. 1F through 1I illustrate devices 100 employing a BOP configuration including a pillar structure 118 having a generally trapezoidal cross-section (e.g., a truncated cone) of varying geometric sizes and dimensions. FIGS. 1J through 1M illustrate devices 100 employing a RDL configuration that include a pillar structure 118 having a generally rectangular cross-section (e.g., a rectangular cube) of varying geometric sizes and dimensions. FIGS. 1N through 1Q illustrate devices employing a RDL configuration including a pillar structure 118 having a generally trapezoidal cross-section (e.g., a truncated cone) of varying dimensions. FIGS. 1R and 1S illustrate devices 100 (FIG. 1R illustrates a device 100 employing a RDL configuration, while FIG. 1S illustrates a device 100 employing a BOP configuration) having a first pillar structure portion 118A and a second pillar structure portion 118B disposed over the first pillar structure portion 118A (e.g., directly on the first pillar structure portion 118A, on an intermediate layer or structure formed on the first pillar structure portion 118A, combinations thereof, and so forth). In implementations, the first pillar structure portion 118A is formed on the bump interface 112 (e.g., using suitable deposition techniques). The second pillar structure portion 118B is then formed on the first pillar structure portion 118A (e.g., using suitable deposition techniques). As shown, the width of the second pillar structure portion 118B may be less than the width of the first pillar structure portion 118A. However, it is contemplated that the second pillar structure portion 118B and the first pillar structure portion 118A may have at least approximately the same width depending on design/fabrication considerations of the device 100. The height of the pillar structure portions 118A, 118B are measured from the top surface of the UBM 114 to the top surface of the pillar structure portion 118B (see FIG. 1R). As shown in FIGS. 1T through 1W, the devices 100 may employ a pillar structure 118 extending from (e.g., disposed directly on) the RDL structure 113. Thus, in implementations, the devices 100 may be fabricated without a bump interface 112 and have a pillar structure 118 formed directly on the RDL structure 113.

Example Fabrication Processes

Figure 2:
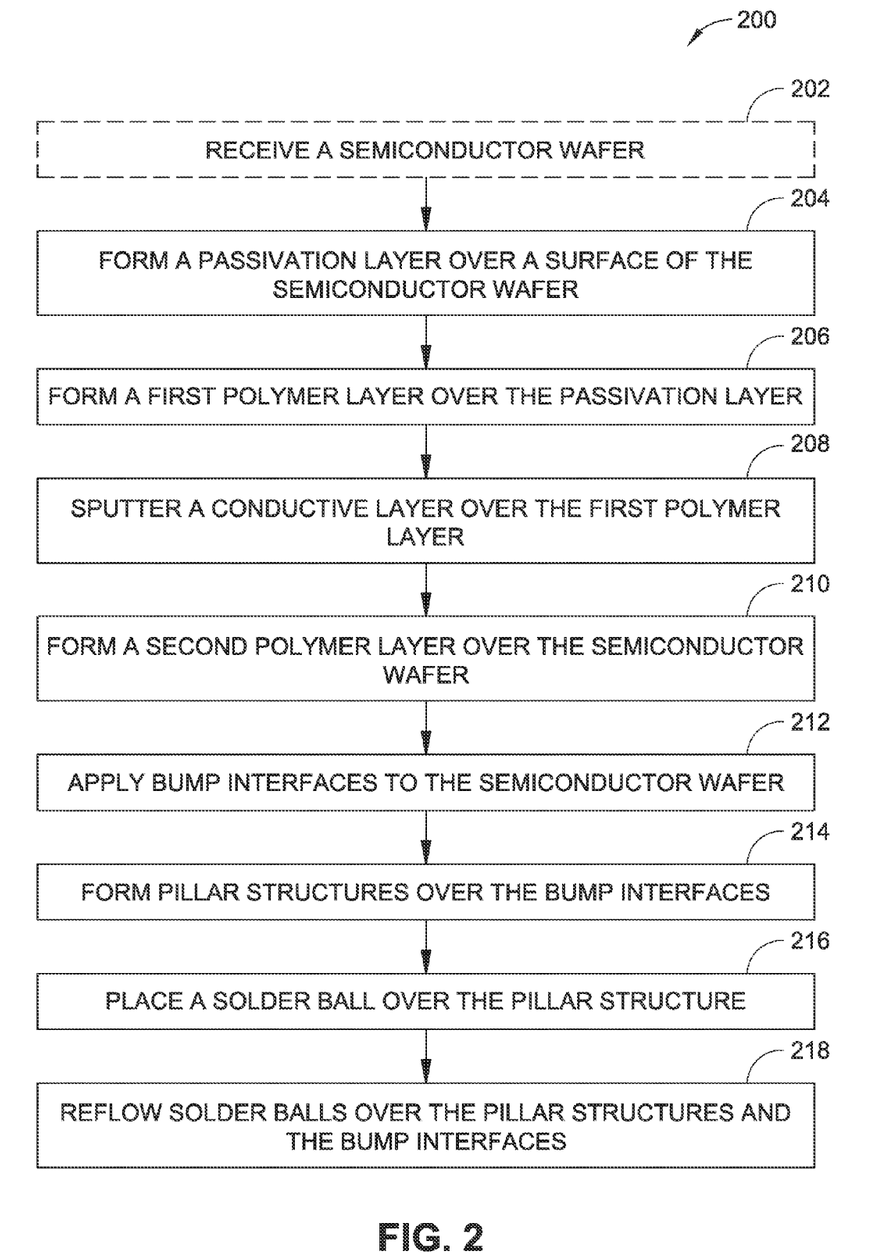
FIG. 2 is a flow diagram illustrating a process in an example implementation for fabricating flexible wafer-level package devices, such as the device shown in FIG. 1A.
Figure 3:
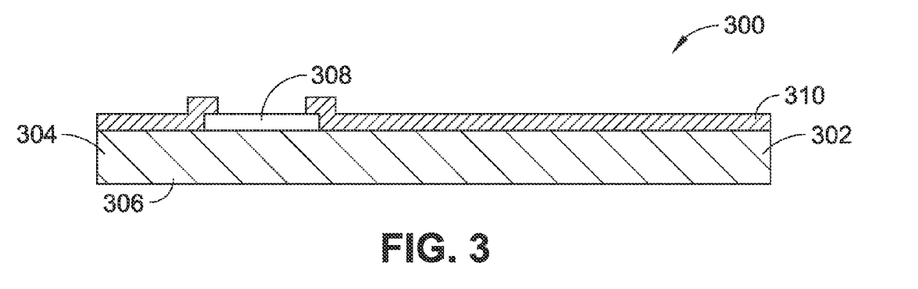
FIG. 3 through 9 are diagrammatic partial cross-sectional side elevation views illustrating the fabrication of a wafer-level package device, such as the device shown in FIG. 1A, in accordance with the process shown in FIG. 2.
Figure 4:
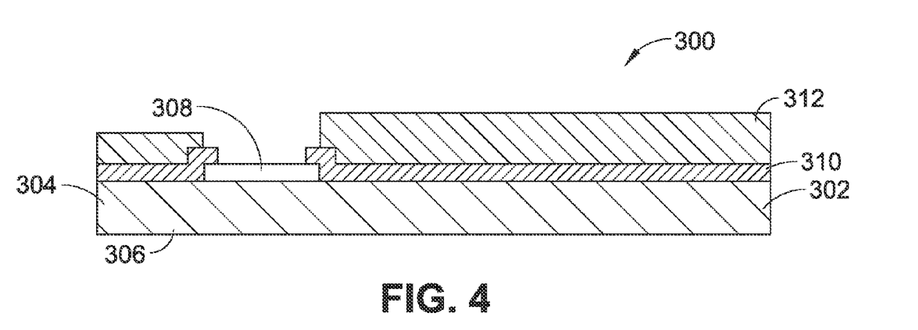

FIG. 2 illustrates an example process 200 that employs wafer-level packaging techniques to fabricate semiconductor devices, such as the wafer-level package devices 100 shown in FIGS. 1A through 1W. FIGS. 3 through 9 illustrate sections 300 of example semiconductor wafers 302 that are utilized to fabricate semiconductor devices (such as devices 100 shown in FIGS. 1A through 1W). In FIG. 3, a section 300 of the semiconductor wafer 302 is illustrated prior to the wafer 302 being segmented into individual integrated circuit devices (e.g. devices 100 shown in FIGS. 1A through 1W). It is contemplated that the sections 300 of the semiconductor wafer 302 may include one or more integrated circuits formed therein. Together, these integrated circuits form an integrated circuit chip (die) 304 that comprises a semiconductor substrate 306. The integrated circuits may comprise digital circuit technology, analog circuit technology, mixed-signal technology, and so forth. The integrated circuits are connected to one or more conductive layers (e.g., contact pads, redistributions structures, and so forth) that provide electrical contacts through which the integrated circuits are interconnected to other components associated with the device 100, such as printed circuit boards, and so forth. For instance, as illustrated in FIG. 3, the section 300 of the semiconductor wafer 302 illustrated includes contact pads 308 positioned on the substrate 306 to provide electrical contact to the integrated circuits. In implementations, the contact pad 308 may be formed from aluminum.

As shown in FIG. 2, a semiconductor wafer may be received (Block 202) for processing. As described above, the wafer 302 may have been processed to form one or more integrated circuits. A passivation layer is formed over a surface of a wafer (Block 204). For example, as shown in FIG. 3, a passivation layer 310 (e.g., an oxide material, and so forth) is formed over a surface of the wafer 302. The passivation layer 310 may be deposited via one or more suitable deposition techniques, such as physical vapor deposition, chemical vapor deposition, molecular beam epitaxy, and so forth. The passivation layer 310 is also etched to at least partially expose the contact pad 308.

A first polymer layer is formed over the passivation layer (Block 206). The polymer layer 312 may be deposited over the passivation layer 310 through one or more suitable deposition techniques (see FIG. 4). After deposition, the polymer layer 312 is etched to at least partially expose the contact pad 308. In implementations, the polymer layer 312 may comprise a suitable dielectric material, such as benzocyclobutene polymer (BCB), Polyimide (PI), Polybenzoxazole (PBO), silicon dioxide ($SiO_2$), and so forth.

Figure 5:
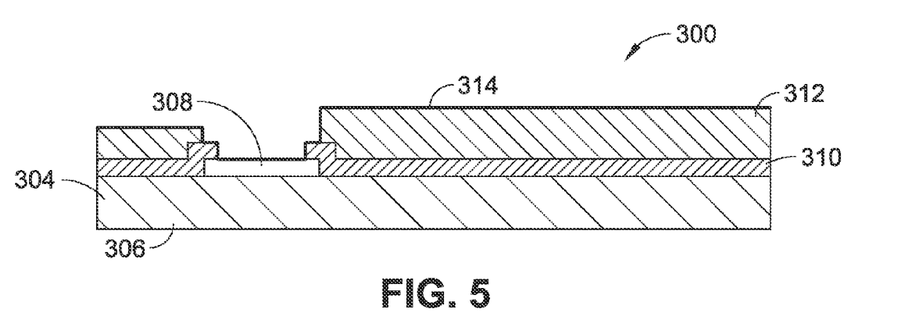
Figure 6:
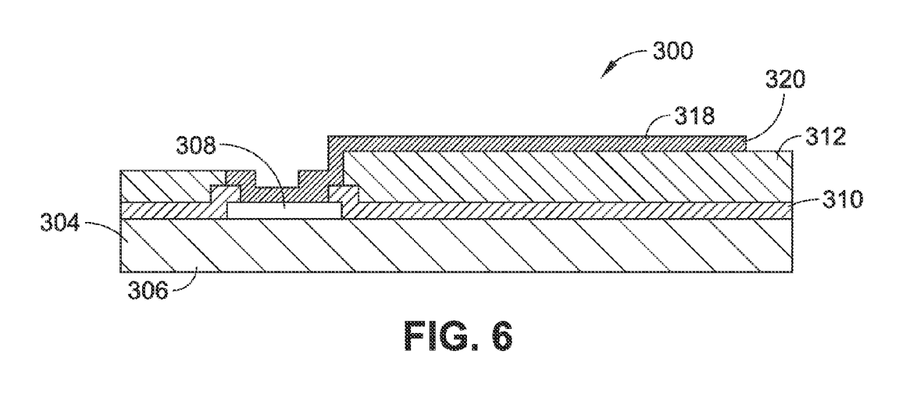

A conductive layer is then sputtered over the first polymer layer (Block 208). As shown in FIG. 5, a conductive layer 314 (e.g., a suitable metal film layer) is sputtered over the contact pad 308 and the polymer layer 312 for electrolytic plating purposes. A redistribution (RDL) structure 320 is formed over the conductive layer 314 and the polymer layer 312 (see FIG. 6). In implementations, a conductive material 318 is deposited over the conductive layer 314 and the polymer layer, and then selectively etched to form a RDL structure 320. While FIGS. 6 through 9 illustrate configuration that employs an RDL structure 320, it is understood that a BOP configuration may also be employed, as described above with respect to devices 100 shown in FIGS. 1A through 1I and 1S.

Figure 7:
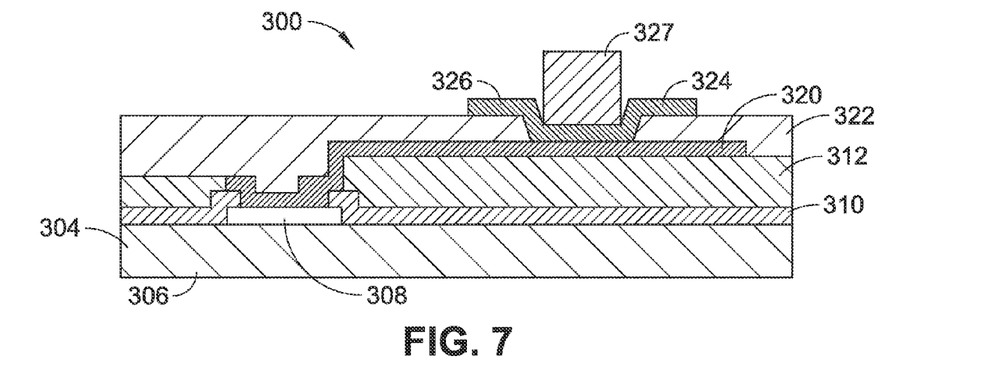
Figure 8:
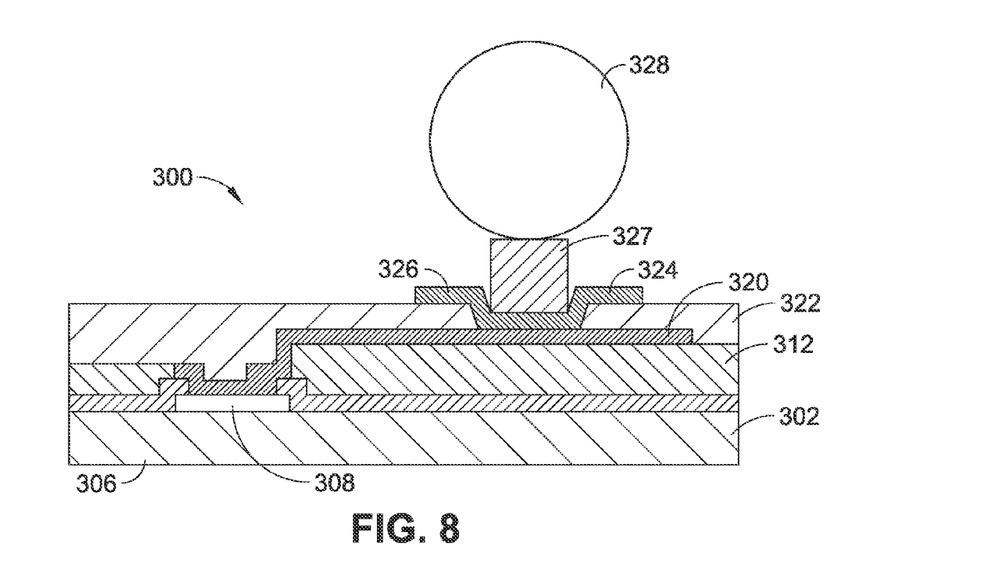

As shown in FIG. 2, a second polymer layer is formed over the wafer (Block 210). A second polymer layer 322 is deposited over the surface (e.g., over the RDL structure 320 and the first polymer layer 312) of the wafer 302 (see FIG. 7). The second polymer layer 322 may comprise a suitable dielectric material, such as benzocyclobutene polymer (BCB), Polyimide (PI), Polybenzoxazole (PBO), silicon dioxide ($SiO_2$), and so forth. The second polymer layer 322 is selectively etched to at least partially expose the RDL structure 320. Once the second polymer layer is etched, a bump interface is applied to the contact pads deployed over the semiconductor wafer (Block 212). FIG. 7 illustrates a bump interface 324 formed (e.g., deposited, patterned, etched) over a contact pad 308 and at least partially over the second polymer layer 322. As shown, the bump interface 324 comprises a UBM structure 326 that interfaces with the RDL structure 320. However, in some implementations, the bump interface 324 may also interface with a copper pillar.

Pillar structures are formed over the bump interfaces (Block 214). FIG. 7 illustrates the pillar structure 327 formed over the bump interface 324 (e.g., UBM structure 326). The pillar structure 327 may be formed via a suitable copper plating process, and so forth. As described above, the size, shape, and dimensions of the pillar structure 327 may vary according to the various design/fabrication considerations of the wafer-level package device (e.g. device 100). For example, the pillar structure 327 may extend from the integrated circuit chip 304 to a height of about thirty-five micrometers (35 μm) to about sixty micrometers (60 μm). In another example, diameter of a cylindrically-shaped (e.g., rectangular cross-section) pillar structure 327 may range from about forty micrometer (40 μm) to about eighty percent (80%) of the diameter of second polymer layer 322 (e.g., passivation layer) opening. In yet another example, the diameter (D) of a conically-shaped (e.g., trapezoidal cross-section) pillar structure 327 may range from about thirty-five micrometers (35 μm) to about eighty percent (80%) of the diameter of second polymer layer 322 (e.g., passivation layer) opening.

In implementations, the pillar structure 327 may be formed over the RDL structure 320 (via a suitable plating process). In such implementations, bump interfaces are not applied (e.g., Block 212 of FIG. 2 is skipped). Thus, as described above, the integrated circuit chips 304 may be fabricated without bump interfaces 324, and may have pillar structures 327 formed directly on the RDL structure 320.

Figure 9:
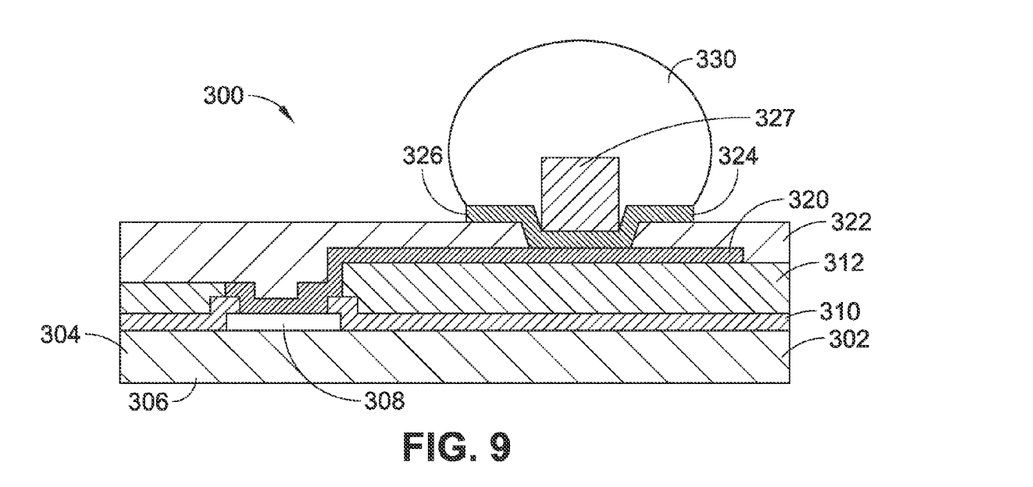

As shown in FIG. 2, a solder ball is placed onto the pillar structure (Block 216). For example, in FIG. 8 flux has been applied to the pillar structure 327 and a solder ball 328 positioned onto the pillar structure on the flux. The solder ball 328 may be held to the pillar structure by the flux until the wafer 302 is subjected to a suitable reflow process. The solder ball is then reflowed over the pillar structure and the bump interface to form a solder bump (Block 218). As shown in FIG. 9, solder bumps 330 (e.g., reflowed solder balls) are formed over the pillar structure 327. The pillar structure 327 extends at least partially into the solder bumps 330 to provide support and to mitigate stresses to the solder bumps 330. For example, the pillar structure 327 may function as a physical barrier to crack propagation within the solder bumps 330. In implementations, the pillar structure 327 may be selectively provided about the periphery of the integrated circuit chips 304 (e.g., disposed within solder bumps 330 near the edges of the integrated circuit chips 304). Once the wafer fabrication process is complete, suitable wafer-level packaging processes may be employed to segment and package the integrated circuit chips 304 into wafer-level package devices (e.g., wafer-level package devices 100 of FIGS. 1A through 1W).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A process comprising:
applying a bump interface to a contact pad of the semiconductor wafer, the semiconductor wafer processed to form one or more integrated circuits therein;
forming a first pillar structure portion over the bump interface and forming a second pillar structure portion over the first pillar structure portion, the first pillar structure portion and the second pillar structure portion comprising a pillar structure;
placing a solder ball onto the pillar structure; and
reflowing the solder ball over the pillar structure and the bump interface to form a solder bump, the pillar structure extending at least partially into the solder bump.

2. The process as recited in claim 1, wherein the pillar structure extends from the integrated circuit chip to a height of about thirty-five micrometers (35 μm) to about sixty micrometers (60 μm).

3. The process as recited in claim 1, wherein a diameter of the pillar structure ranges from about thirty-five micrometers (35 μm) to about eighty percent (80%) of a diameter of a passivation layer disposed about the solder bump.

4. The process as recited in claim 1, wherein the first pillar structure portion has a first width and the second pillar structure portion has a second width, the first width greater than the second width.

5. The process as recited in claim 1, wherein the pillar structure is comprised of copper.

6. A process comprising:
applying a bump interface to a contact pad of the semiconductor wafer, the semiconductor wafer processed to form one or more integrated circuits therein;
forming a first pillar structure portion over the bump interface and forming a second pillar structure portion over the first pillar structure portion, the first pillar structure portion and the second pillar structure portion comprising a pillar structure, the first pillar structure portion having a first width and the second pillar structure portion having a second width, wherein the first width greater than the second width;
placing a solder ball onto the pillar structure; and
reflowing the solder ball over the pillar structure and the bump interface to form a solder bump, the pillar structure extending at least partially into the solder bump.

7. The process as recited in claim 6, wherein the pillar structure extends from the integrated circuit chip to a height of about thirty-five micrometers (35 μm) to about sixty micrometers (60 μm).

8. The process as recited in claim 6, wherein a diameter of the pillar structure ranges from about thirty-five micrometers (35 μm) to about eighty percent (80%) of a diameter of a passivation layer disposed about the solder bump.

9. The process as recited in claim 6, wherein the pillar structure is comprised of copper.

* * * * *